US010250954B2

(12) United States Patent
Christie et al.

(10) Patent No.: US 10,250,954 B2
(45) Date of Patent: Apr. 2, 2019

(54) ELECTRONICS MODULE FOR COUPLING TO A MODULE ARRANGEMENT AND MODULE ARRANGEMENT

(71) Applicant: BUERKERT WERKE GMBH & CO. KG., Ingelfingen (DE)

(72) Inventors: Christopher Christie, Untermuenkheim (DE); Thomas Diem, Neuenstein (DE)

(73) Assignee: BUERKERT WERKE GMBH & CO. KG, Ingelfingen (DE)

( * ) Notice: Subject to any disclaimer, the term of this patent is extended or adjusted under 35 U.S.C. 154(b) by 0 days.

(21) Appl. No.: 15/939,720

(22) Filed: Mar. 29, 2018

(65) Prior Publication Data

US 2018/0302696 A1    Oct. 18, 2018

(30) Foreign Application Priority Data

Apr. 18, 2017 (DE) ................. 10 2017 108 183

(51) Int. Cl.
*H05K 5/00* (2006.01)
*H01R 12/72* (2011.01)
(Continued)

(52) U.S. Cl.
CPC ............ *H04Q 1/06* (2013.01); *H04Q 1/025* (2013.01); *H05K 5/0021* (2013.01); *H05K 5/0065* (2013.01); *H05K 5/0069* (2013.01); *H05K 5/0073* (2013.01); *H05K 5/0247* (2013.01); *H05K 7/1468* (2013.01); *H05K 7/1478* (2013.01); *H05K 7/186* (2013.01);
(Continued)

(58) Field of Classification Search
None
See application file for complete search history.

(56) References Cited

U.S. PATENT DOCUMENTS 6,033,257 A * 3/2000 Lake ................. G05B 19/0423
                                                       439/502
6,492,650 B1 * 12/2002 Imai ....................... G08C 23/06
                                                       250/221
(Continued)

FOREIGN PATENT DOCUMENTS

DE         10355143 A    11/2004
DE     102015101133 A1    7/2016

*Primary Examiner* — Xanthia C Cunningham
(74) *Attorney, Agent, or Firm* — McNees Wallace & Nurick LLC

(57) ABSTRACT

An electronics module for coupling to a module arrangement, in particular valve island, in a line-up direction, comprises a casing which comprises a front side, a back side, an upper side, a bottom side and two opposite lateral surfaces extending along the line-up direction in relation to a state mounted on the module arrangement. In the casing an electronics is accommodated and at least a first bus connection and two second bus connections are provided, which are connected to the electronics within the casing. The at least one first bus connection is arranged either on the upper side or on the bottom side, while a second bus connection is arranged on each of the lateral surfaces, respectively. A module assembly comprises a module arrangement, in particular a valve island, and an electronics module, wherein the electronics module directly abuts on the module arrangement in the line-up direction, and is detachably connected thereto in a non-destructive manner.

16 Claims, 3 Drawing Sheets

(51) Int. Cl.
   *H04Q 1/06* (2006.01)
   *H05K 5/02* (2006.01)
   *H05K 7/18* (2006.01)
   *H05K 7/14* (2006.01)
   *H04Q 1/02* (2006.01)

(52) U.S. Cl.
   CPC ....... *H01R 12/72* (2013.01); *H04Q 2201/802* (2013.01); *H05K 5/0017* (2013.01)

(56) References Cited

U.S. PATENT DOCUMENTS

| | | | |
|---|---|---|---|
| 6,869,320 B2 | 3/2005 | Haas et al. | |
| 6,959,084 B1 | 10/2005 | DeCraene | |
| 7,228,876 B1* | 6/2007 | Zub | F15B 13/0814 137/625.64 |
| 9,019,718 B2* | 4/2015 | Bdeir | H01R 13/6205 |
| 9,622,370 B2 | 4/2017 | Gehrke et al. | |
| 2001/0029987 A1* | 10/2001 | Rondreux | F15B 13/0807 137/883 |
| 2004/0112440 A1* | 6/2004 | Bramley | F15B 13/0814 137/596.16 |
| 2005/0096756 A1* | 5/2005 | Quast | F15B 13/0839 700/19 |
| 2007/0133153 A1* | 6/2007 | Moeker | F15B 13/0814 361/679.41 |
| 2008/0208366 A1* | 8/2008 | Dalby | F15B 13/0867 700/3 |
| 2009/0010739 A1* | 1/2009 | Hinderer | B23P 21/00 414/222.07 |
| 2009/0226180 A1* | 9/2009 | Quast | H04B 10/801 398/139 |
| 2009/0307405 A1* | 12/2009 | Ottliczky | F15B 13/0853 710/305 |
| 2011/0320065 A1 | 12/2011 | Ying | |
| 2012/0037250 A1* | 2/2012 | Berner | F15B 11/006 137/625 |
| 2013/0037128 A1* | 2/2013 | Didier | F15B 13/0817 137/315.01 |
| 2013/0205923 A1* | 8/2013 | Brammer | F16L 37/004 73/864.81 |
| 2017/0082343 A1 | 3/2017 | Boyd | |
| 2017/0250493 A1* | 8/2017 | Iijima | H01R 13/514 |
| 2017/0356475 A1* | 12/2017 | Hamm | F16K 31/0675 |
| 2017/0356568 A1* | 12/2017 | Hamm | F15B 15/20 |
| 2018/0163884 A1* | 6/2018 | Bendotti | F15B 13/0817 |

* cited by examiner

ELECTRONICS MODULE FOR COUPLING TO A MODULE ARRANGEMENT AND MODULE ARRANGEMENT

FIELD OF THE INVENTION

The invention relates to an electronics module for coupling to a module arrangement, in particular a valve island, and a module arrangement.

BACKGROUND

Valve islands are valve arrangements, which are used for controlling complex pneumatic systems, for example. A plurality of valves may be integrated in a valve island at one place and may be supplied with electric and fluid energy (by a pneumatic or hydraulic control fluid) by means of a common centralized supply, for example. In addition, a centralized power supply may be provided in the valve island. Often different kind of modules, also modules for a dedicated purpose, which may be adapted as valve modules, purely electronics modules, diagnosis modules or fluid introduction modules, for example, are plugged together along a line-up direction as a modular system, whereby this kind of valve islands offer a very high degree of flexibility. Valve islands are units comprising numerous valves which are separate components with an own outer housing. The valves are attachable next to each other along a line-up direction to a separate fastening structure, i.e. a separate component. The valves can be attached to and removed from the fastening structure. Thus, valve islands are flexibly usable modules wherein the number of valves attached to the fastening structure can be easily adapted to the use and purpose of the valve island. Valve islands are assemblies that are used for example for actuating complex pneumatic systems. A plurality of valves thereby can be constructionally combined in one place and can be supplied with electric and fluidic energy (by a pneumatic or hydraulic control fluid) e.g. via a common central supply unit.

In general, such a module arrangement comprises a capability for internal data communication, by means of which the single valves may be addressed in a valve island. Said data communication is carried out by means of an internal bus of the module arrangement, for example. Said internal bus may comprise an external connection on one of the outer sides of the module arrangement.

However, it is often required to enable data communication with external devices, in order to control single valves or also to transmit data, for example. Hereto, additional external data cables have to be connected to the module arrangement.

Usually, for this kind of module arrangement a mounting orientation is fixedly predetermined, and the module arrangement may only be fixed in one specific orientation, for example in the switch cabinet, which also defines a front side and a back side and an upper side and a bottom side of the module arrangement. Here, the front side is defined as the side, which is accessible by a user, while the back side, which is basically opposite to the front side, is in particular facing a wall of the switch cabinet and may be used to fasten the complete module arrangement. Often, the mounting orientation is selected in a way that the upper and lower side are aligned more or less perpendicular to the vertical direction.

The line-up direction extends here along the front side and the back side of the module arrangement and in particular horizontal to the mounting orientation.

In case the module arrangement is mounted in a switch cabinet, there is normally not much space left. For example, for connections to external lines, which are aligned in the forward direction, often space-related issues occur, especially in flat switch cabinets, as the connection cables may not be bent in a radius of an arbitrarily small size. In addition, the connected cables are routed in an area where they interfere with the operation of the module arrangement.

It is an object of the invention to enhance the connection options of a cable, which is routed externally to the module arrangement.

SUMMARY

The present invention provides an electronics module for coupling to a module arrangement for coupling to a module arrangement, in particular a valve island, comprises in a line-up direction of the modules a casing and in relation to a state mounted on the module arrangement, a front side, a back side, an upper side, a bottom side, and two opposite lateral surfaces, the lateral surfaces if extending along the line-up direction. In the casing an electronics is accommodated and at least a first bus connection and two second bus connections are provided, which are connected to the electronics within the casing. The at least one bus connection is either arranged on the upper side or on the bottom side, while a second bus connection is arranged on each of the lateral surfaces, respectively. Said positioning of the bus connections allows to mount the electronics module on the module arrangement in different orientations, but at the same position in relation to the module arrangement, whereby a connection of external cables may be more flexibly adapted to the respective mounting conditions.

The designation of the sides of the casing used here refers to the regular mounted state of the module arrangement in the fixedly predetermined mounting orientation thereof. Here, the front side and the back side of the electronics module basically have the same orientation as the front side and the back side of the module arrangement, that is, the front side of the electronics module is facing a user, who is standing in front of the module arrangement, while the back side of the electronics module is aligned in a direction facing way of the user and is facing a wall in most cases.

The casing of the electronics module is preferably generally shaped as a cuboid.

The first bus connection(s) are advantageously only provided on the respective upper and bottom sides in order to eliminate costs for additional connections, while the respective other surface includes no first bus connection. However, also a plurality of any kind of bus connections may be provided on the respective surface, thus the upper side includes two or three first bus connections, for example, but the lower side does not have any bus connections.

However, both lateral surfaces should include an identical number of second bus connections, respectively, which may deviate from the number of first bus connections on the upper or bottom sides.

Of course, the connection type of the first bus connections may vary, in case a plurality of first bus connections is provided in order to be able to connect external cables in a most flexible way.

In a preferred embodiment, the second bus connections are arranged on the two lateral surfaces in a rotational symmetric way regarding an axis of rotation extending perpendicular to the line-up direction and through the front side of the electronics module in relation to the state mounted on the module arrangement, so that at a rotation of 180° around the axis of rotation, the position of the second bus connection, which is positioned on the lateral surface oriented towards the module arrangement, respectively, is identical for both lateral surfaces. Preferably, here both lateral surfaces are configured in a rotationally symmetric way in relation to the second bus connections. When the electronics module is thus rotated 180° around the axis of rotation, the upper side and the bottom side of the casing of the electronics module and the two lateral surfaces thereof are exchanged, and the first bus connection changes its position. Here, the front side of the electronics module is rotated around the axis of rotation, but is not moved out of the plane described by said rotation in space (in an ideal form).

Thus, the second bus connections indeed change their positions, but remain in an identical position regarding the module arrangement thereof. Thus, in both orientations of the electronics module a simple coupling to an interface of the module arrangement by means of the second bus connection is possible, and the user may decide, whether to route external cables to the module arrangement on the upper side thereof or the bottom side thereof.

Advantageously, here the two second bus connections are configured identically, that is of the same kind or of the same type (both as connectors both as sockets) and are connected to the electronics in an identical way, so that it is of no difference for data transmission and/or power supply via which of the two lateral surfaces the electronics module is connected to the module arrangement.

Here, the at least one first bus connection forms, as already mentioned above, preferably a connection to an external bus, or also other cables routed from external components.

However advantageously, the second bus connections form connections to an internal bus of the module arrangement, by means of which a simple connection between cables, which are connected from outside, and internal power and/or data lines of the module arrangement may be established.

In order to enable a simple handling, preferably both lateral surfaces of the electronics modules, which extend parallel to the axis of rotation and perpendicular to the direction of the alignment, respectively, are aligned parallel to one another in relation to a state mounted on the module arrangement.

In order to fix the electronics modules to the module arrangement in a secure way, the electronics module preferably comprises at least one fastening device for connection to the module arrangement. The second bus connections on both lateral surfaces are arranged in particular in a rotationally symmetric way to said fastening device. The axis of rotation preferably also extends through the fastening device.

The fastening device may for example be one or more, preferably two, fastening openings, which are in particular formed in a way protruding through the electronics module.

Alternatively or in addition, a support rail fixture may be arranged on the back side of the electronics module, which may also be positioned at the height of the axis of rotation and symmetrically to the axis of rotation, by means of which the electronics module may be slid onto a support rail, for example a top-hat rail, or may be suspended therein.

This enables to configure the fastening device in such a way that each of the two lateral surfaces of the casing may be coupled to the module arrangement in a simple way.

A rotation around an axis of rotation extending through the front side and perpendicular to the line-up direction has the advantage that the front side of the electronics module may change its orientation, but keeps its general position in relation to the module arrangement. Therefore, at least a display device and/or at least an operating element may be arranged on the front side of the electronics module, as the front side remains accessible for the user in a simple way in any possible orientation of the electronics module.

In case the display device includes a graphic display, the electronics and the display device are preferably configured to allow to turn a presentation direction of the display about 180°, so that the display may be easily read in both orientations of the electronics module. Hereto, for example a position sensor may be provided in the electronics module, or the presentation of the display is changed by software according to the contact of the second bus connection on the respective lateral surface.

Theoretically it may also be conceivable that all second bus connections are arranged on one of the two lateral surfaces and to arrange them in a rotationally symmetric way in relation to the axis of rotation extending along the line-up direction. Hereby, also a rotational symmetry of 90° may be realized as an alternative to a rotational symmetry of 180°. However, such an arrangement has the disadvantage that the front side of the electronics module changes its place in space during rotation of the electronics module and may thus not be used for displaying. Further, also a support rail fixture for the electronics module is eliminated.

Preferably, the electronics is configured as a gateway, thus communication between the external and the internal bus is enabled. Here, the electronics is advantageously configured to convert different communication protocols into one another, which further enhances flexibility.

In a module assembly having a module arrangement, in particular a valve island, and an electronics module described above, the electronics module abuts directly on the module arrangement in the line-up direction and is detachably connected thereto in a non-destructive way. This way, the electronics module has only to be inserted, in case it is required and may also be exchanged between module arrangements. Here, the front side of the electronics module forms an extension of the front side of the module arrangement when viewed in the line-up direction and is easily accessible by the user. The front side of the electronics module may extend more or less in the vertical direction.

The electronics module may preferably be coupled to the module arrangement in two different orientations, wherein it is rotated 180° around the axis of rotation in the second orientation in relation to the first orientation.

The module arrangement may for example comprise electrofluid modules, purely fluid modules, and/or purely electronics modules, as has been described above.

In a possible configuration, an intermediate module is arranged adjacent to the electronics module in the module arrangement, which includes a mechanical fastening device for connection to the electronics module, for example threaded bores, in which screws may engage, which protrude through the through-openings in the electronics module.

This mechanical fastening device is preferably provided in the front face, which is oriented in the line-up direction, of the module arrangement, onto which the electronics modules has to be connected.

The electronics module may be advantageously connected to the module arrangement with each of the two lateral surfaces thereof even when rotated 180° around the axis of rotation, wherein the front face, which is oriented in the line-up direction, of the module arrangement (12), where the electronics module is to be connected, comprises a bus connection for the internal bus of the module arrangement, which is compatible with the second bus connection of the electronics module, and wherein the second bus connection of the lateral surface of the casing of the electronics module, which is oriented towards the module arrangement, is connected to the internal bus connection of the module arrangement, when the electronics module is mounted on the module arrangement. By simply plugging-in the electronics module on the front face of the module arrangement, thus a connection between the external bus connection and the internal bus of the module arrangement may be created.

The connection between the second bus connection of the electronics module and the internal bus connection of the module arrangement is preferably a plug-in connection, which is closed by plugging-in of the electronics module in the line-up direction. Said connection may be simply removed by detaching the electronics module.

DETAILED DESCRIPTION

In general, for the sake of clarity, not all components, which are repeatedly used in the figures, will be designated with individual reference numbers.

Figure 1:
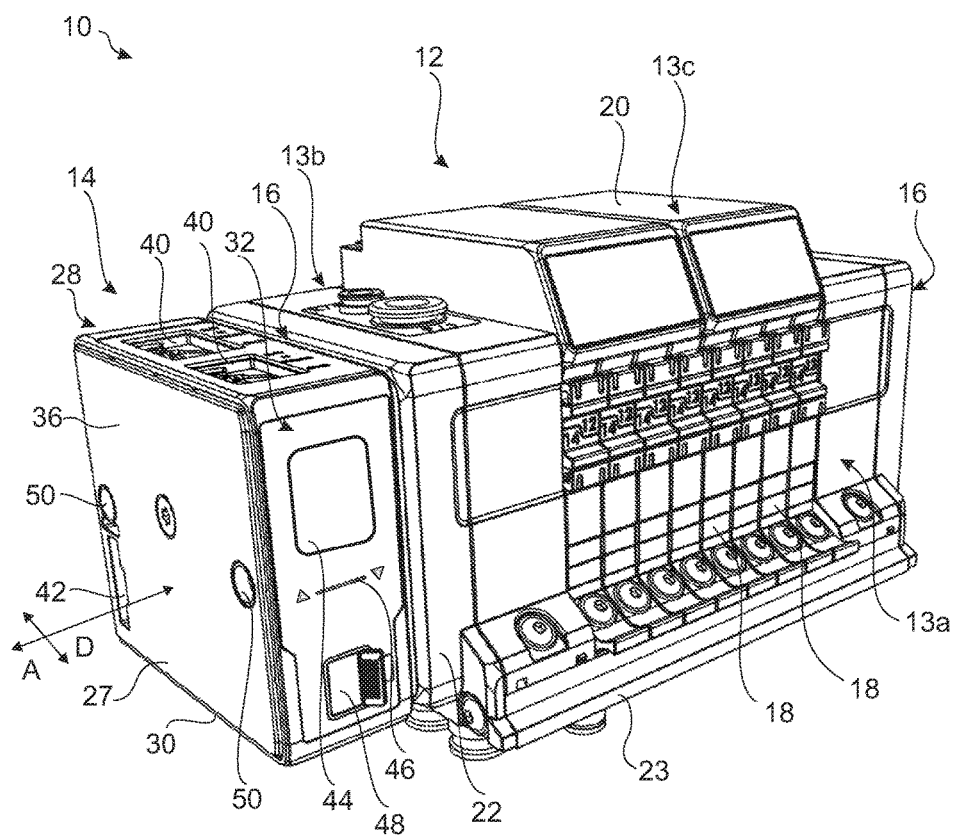
FIG. 1 a schematic perspective representation of a module assembly according to the invention in the predetermined mounting orientation including an electronics module and a module arrangement.

FIG. 1 shows a module assembly 10, which in this example is composed of a module arrangement 12, here configured as a valve island, and an electronics module 14.

Any directional specifications relate to the module assembly 10 in the state mounted in a switch cabinet, for example, wherein the module arrangement 12 defines a fixed mounting orientation, which is shown in FIG. 1.

The module arrangement 12 has a more or less cuboid form and includes a front side 13a, which is oriented towards the free space and may easily be accessed by a user, a back side 13b, an upper side 13c, a bottom side 13d and two front faces 16. The back side 13b is oriented towards a wall of the switch cabinet, for example. The front faces 16 delimit the module arrangement 12 along the line-up direction A of the single modules of the module arrangement 12, and are arranged perpendicular thereto. In general, the front side 13a and the back side 13b extend more or less in the vertical direction, and the upper side 13c and the bottom side 13d extend more or less in the horizontal direction, with the exception of a variety of protrusions, recesses and taperings which are caused by function and design.

The electronics module 14 is connected to one of the front faces 16 of the module arrangement 12, as viewed along the line-up direction A. In this example, the module arrangement 12 comprises a plurality of electrofluid modules 18, electronic display modules 20, and an intermediate module 22.

The electrofluid modules 18 and the intermediate module 22 are arranged along the line-up direction A, wherein said components are accommodated on a base body 23, which is not shown in detail, in which fluid connections and fluid lines and a continuous power and data supply are also provided. Here, the latter is formed here on a printed circuit board 24 (see FIG. 5), wherein conductive paths arranged on the printed circuit board 24 form data and/or power lines, which in total form an internal bus of the module arrangement 12.

On at least one front face 16 of the module arrangement 12, the internal bus terminates in an internal bus connection 26, which may be accessed from outside of the module arrangement 12.

The electrofluid modules 18 each comprise at least one valve, wherein in general a main valve is provided configured as a gate valve, and one or more electromagnetic valves are provided as control valves in each electrofluid module 18.

Any components of the module arrangement 12 may be connected to the internal bus 12, exchange data by means thereof and/or are supplied with power thereby.

In this example, the printed circuit board 24 is arranged in the rear upper region of the module arrangement 12, more specifically of the base body 23 thereof, so that in particular the electrofluid modules 18 may be connected to the internal bus by means of simple plug-in connections. Accordingly, the internal bus connection 26 is arranged in the rear upper region of the front face 16.

The electronics module 14 has here basically the shape of a cuboid and includes a casing 27 having an upper side 28, a bottom side 30, a front side 32, a back side 34 and two lateral surfaces 36, 38. Both lateral surfaces 36, 38 are aligned in a way that they extend along the line-up direction A and are basically arranged perpendicular to the line-up direction A along the complete area thereof.

The lateral surfaces 36, 38 are aligned parallel to the front faces 16 of the module arrangement 12. Basically, the front face 32 and the back side 34 of the electronics module 14 extend in the extension of the front side 13a or of the back side 13b of the module arrangement 12.

On the upper side 28 at least one first bus connection 40 is arranged. In the example shown in FIGS. 1 to 3, two first bus connections 40 are provided, while there is only a first bus connection 40 in the variant shown in FIG. 4.

The two first bus connections 40 may be configured in an identical or different way in order to enable a connection of different cables, which are connected to external components, devices or networks. The exact number of first bus connections 40 may be determined by the one skilled in the art. However, they are all arranged either on the upper side 28 or on the bottom side 30, while the respective other side, that is the bottom side or the upper side accordingly, has no first bus connections 40.

Each of the two lateral surfaces 36, 38 comprises a second bus connection 42. Both second bus connections 42 are configured in an identical way, that is both are formed as sleeve or as connector and are complementary to the internal bus connection 26 of the module arrangement 12, respectively.

Figure 2:
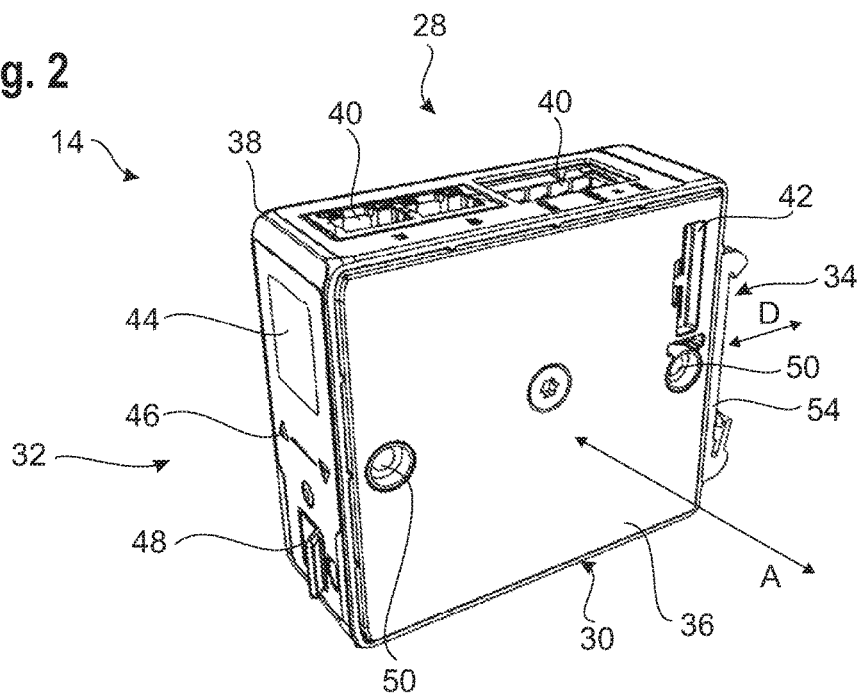
FIGS. 2 and 3 the electronics module of the module assembly from FIG. 1 in two possible orientations.

On the two lateral surfaces 36, 38, the second bus connections 42 are arranged in a rotationally symmetric way in relation to an axis of rotation D, which extends perpendicular to the line-up direction A and through the front side 32, as indicated in FIG. 2. The axis of rotation D thus extends more or less perpendicular to the front side 13a of the module arrangement 12 and is mostly oriented more or less in the horizontal direction.

In case the electronics module 14 is rotated 180° around the axis of rotation D, the positions of the upper side 28 and the lower side 30 are exchanged, just as the two side faces 36, 38, and thus also the second bus connection 42 on the lateral surface 36 and the second bus connection 42 on the opposite lateral surface 38. Due to the rotationally symmetric arrangement of the second bus connections 42, the position of the second bus connection 42 on the lateral surface 36, 38 facing the module arrangement 12, respectively, remains however the same. In addition, the front side 32 rotates around 180° around the axis of rotation D, but remains on the same position in space in the approximate elongation of the front side 13a of the module arrangement 12

Figure 5:
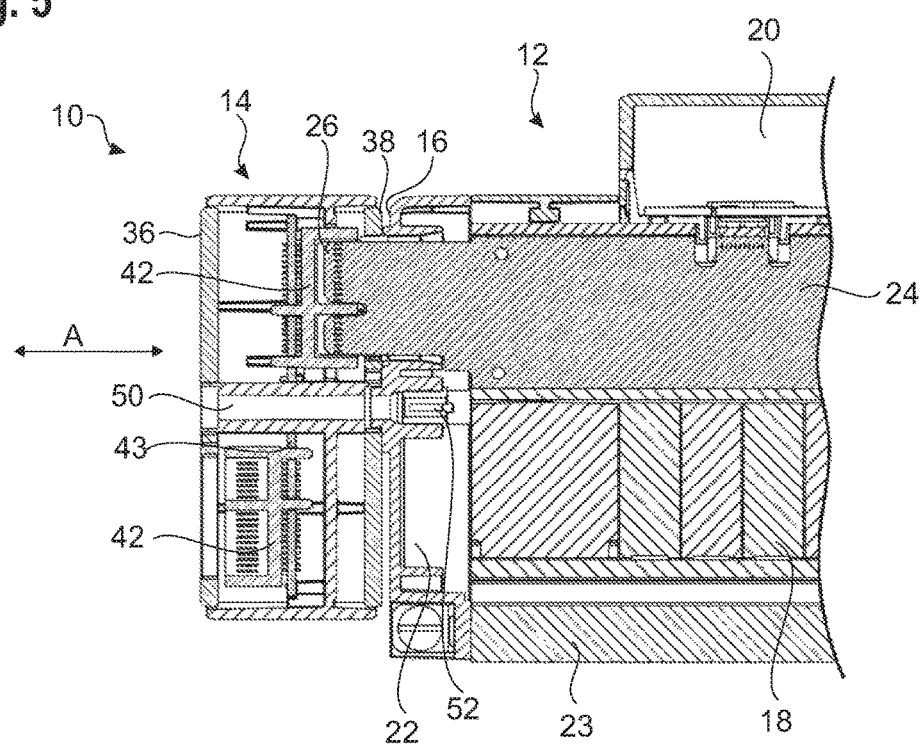
FIG. 5 a schematic section view through a portion of the module assembly of FIG. 1.

The two second bus connections 42 on the lateral surfaces 36, 38 are arranged in a way that the second bus connection 42 on the side of the electronics module 14, which is facing the module arrangement 12, is arranged in the rear upper region respectively, and is positioned in a way, that during coupling of the electronics module 14 to the module arrangement 12, the internal bus connection 26 engages with the second bus connection 42, and thus connects the electronics module 14 to the internal bus of the module arrangement 12, as shown in FIG. 5. The respective other second bus connection 42 is not used.

The possibility to couple the electronics module 14 to the module arrangement 12 in two different orientations allows to provide the first bus connections 40 either on the upper side or on the lower side of the module assembly 10 (corresponding to the upper side 13a and the bottom side 13b of the module assembly 12), which facilitates to connect external cables.

For example, the first bus connection(s) 40 may be used for connection to an external bus system, which may include data lines and/or power lines.

Inside of the casing 27 of the electronics module 14, an electronics 43 is accommodated (as indicated in FIG. 5), which is connected to all bus connections 40, 42 and which enables data communication between the bus connections 40, 42. Here, the electronics is adapted to convert different bus protocols to enable a direct communication between an external bus, which is connected to the first bus connection 40, and the internal bus of the module arrangement 12, which is contacted via the second bus connection 42.

Of course, the electronics 43 may also comprise other suitable electronics components and corresponding software.

Figure 3:
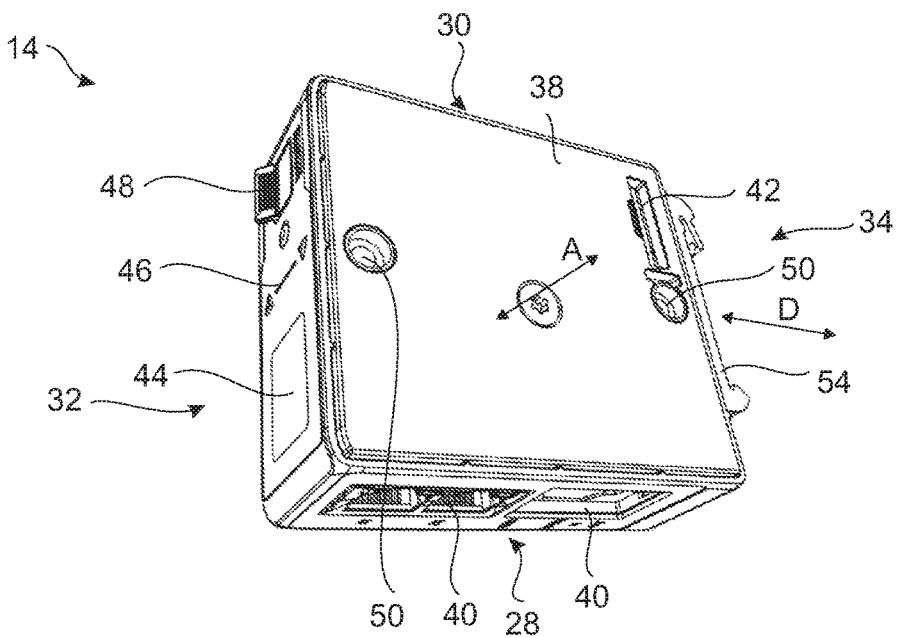

In a preferred embodiment, which is shown in FIGS. 1 to 3, a display device 44 and operating elements 46 are provided on the front side 32 of the electronics module 14. In addition, an ON/OFF switch 48 is arranged here.

The display device 44 may form a graphical user interface. In this case, the electronics 43 comprises components inside the electronics module 14, for example a position sensor, which is able to detect the orientation of the electronics module 14, or a software, which detects, which of the second bus connections 42 is contacted by the internal bus connection 26 of the module arrangement 12, and also an appropriate software to adapt the presentation of the current orientation of the electronics module 14 on the display device 44.

Figure 4:
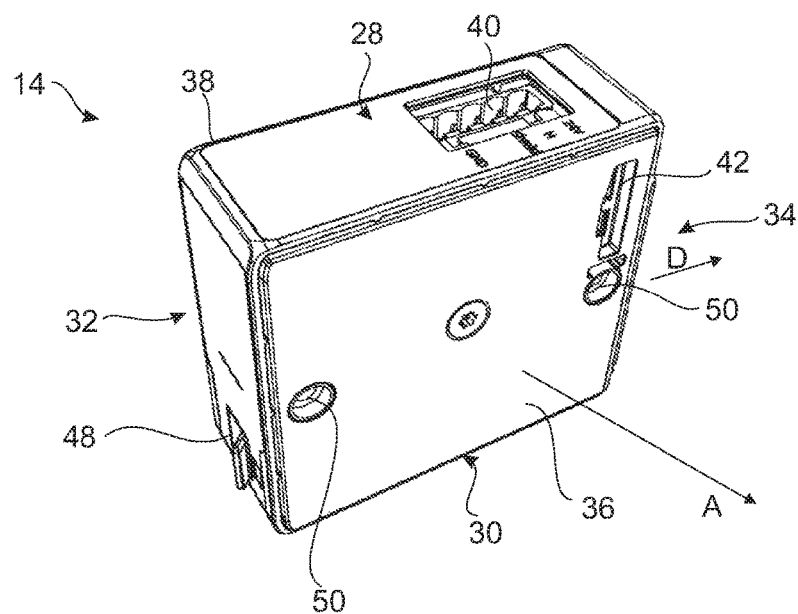
FIG. 4 a schematic perspective representation of the electronics modules of FIG. 1 in a variant.

In the variant shown in FIG. 4, only the display device 44 and the operating elements 46 are omitted. In addition, only one first bus connection 40 is provided on the upper side 28. Apart from that, the two embodiments are identical.

For fastening the electronics module 14 on the front face 16 of the module arrangement 12, the electronics module comprises two through-openings 50 in these examples, which are arranged on a straight line parallel to the axis of rotation D and at the height thereof. In the front face 16, more exactly in the intermediate module 22, two openings 52 provided with threads are formed, which are aligned to the openings 50, in case the electronics module 14 is connected to the module arrangement 12 (see FIG. 5).

In addition, in the embodiments shown here, the electronics module 14 includes a support rail fixture 54 on the back side 34 thereof, by means of which the electronics module 14 may be slid onto or suspended in a support rail, in particular a top-hat rail, which is fastened on the back side of a switch cabinet, for example, like in module arrangement 12. The support rail (and thus also the support rail fixture 54) extends parallel to the alignment direction A.

Also, the support rail fixture 54 is arranged in a rotationally symmetric way in relation to the axis of rotation D, so that the electronics module 14 may be suspended in the support rail in both orientations.

Here, the connection to the internal bus connection 26 is a plug-in connection, which is automatically closed during sliding the electronics module 14 onto the module arrangement 12 in the line-up direction A.

By means of a fixation by means of screws, which are inserted through the openings 50 and with which the threads of the openings 52 engage, the electronics module 14 may be securely coupled to the module arrangement 12. For detaching the electronics module 14, the screws are detached and the electronics module 14 is removed from the module arrangement 12 along the line-up direction A, whereby the plug-in connection to the internal bus connection 26 is also removed. Then, the electronics module 14 may be turned around 180° and again be connected to the module arrangement 12, if required.

In general, according to the invention, two internal bus connections 42 are provided on the electronics module 14, however only one of the internal bus connections 42 is used during operation per use case. The two internal bus connections 42 are used alternatively, wherein the second internal bus connection 42, which is currently not used, is disabled, respectively.

Said configuration ensures, that the user may deliberately choose, whether the external bus connections 40 are arranged on the upper side or the lower side of the module arrangement 12 in order to be easily accessible in the respective specific mounting case thereof. This way, there is always a suitable internal bus connection 42 for adaption to the module arrangement 12 independently of the orientation of the external bus connections (upper side or lower side).

The module arrangement 12 is here fixedly mounted in a predetermined mounting orientation on a support, while the electronics module 14 may be alternatively coupled in two different positions. Both positions are achieved by a rotation of 180° around the axis of rotation D. In order to enable this, two internal bus connections 42 are provided, from which only one is coupled to the module arrangement 12, respectively, while the other remains unused and is not connected.

Because of this, the fastening device is chosen in a way that the internal module connections 42 remain in both positions of the electronics module 14 at the same place and may be used in an identical way.

The invention claimed is:

1. An electronics module for coupling to a module arrangement in a line-up direction, wherein the electronics module includes a casing, which comprises, in relation to a state mounted on the module arrangement, a front side, a back side, and an upper side, a bottom side and two opposite lateral surfaces, the lateral surfaces extending perpendicularly to the line-up direction, wherein an electronics is accommodated in the casing and at least one first bus connection and two second bus connections are provided, which are all connected to the electronics in the casing, wherein the at least one first bus connection is arranged either on the upper side or on the bottom side and a second bus connection is arranged on each of the lateral surfaces respectively, and wherein the second bus connections are arranged in a rotationally symmetric way on the two lateral surfaces in relation to an axis of rotation extending perpendicular to the line-up direction and through the front side, so that at a rotation of 180° around the axis of rotation the position of the respective second bus connection, which is positioned on the lateral surface oriented towards the module arrangement, is identical for both lateral surfaces.

2. The electronics module according to claim 1, wherein the two second bus connections are configured identically.

3. The electronics module according to claim 1, wherein during a rotation of 180° around the axis of rotation, the upper side and the bottom side of the casing and of the electronics module are exchanged.

4. The electronics module according to claim 1, wherein the first bus connection forms a connection for an external bus.

5. The electronics module according to claim 1, wherein the second bus connections form connections for an internal bus of the module arrangement.

6. The electronics module according to claim 1, wherein both lateral surfaces are aligned parallel to each other.

7. The electronics module according to claim 1, wherein at least one display device and/or at least one operating element is arranged on the front side of the electronics module.

8. The electronics module according to claim 7, wherein the electronics and the display device are configured in a way that a display direction of the display device is rotatable about 180°.

9. The electronics module according to claim 1, wherein the electronics is configured as a gateway.

10. The electronics module according to claim 9, wherein the electronics is connected to all bus connections and wherein the electronics is adapted to convert different communication protocols into one another in order to enable a communication between the external bus and the internal bus.

11. An electronics module for coupling to a module arrangement in a line-up direction, wherein the electronics module includes a casing, which comprises, in relation to a state mounted on the module arrangement, a front side, a back side, and an upper side, a bottom side and two opposite lateral surfaces, lateral surfaces extending perpendicularly to the line-up direction, wherein an electronics is accommodated in the casing and at least one first bus connection and two second bus connections are provided, which are all connected to the electronics in the casing, wherein the at least one first bus connection is arranged either on the upper side or on the bottom side and a second bus connection is arranged on each of the lateral surfaces respectively, the electronics module comprising at least one fastening device for connection to the module arrangement, and wherein the fastening device is configured in a way that each of the two lateral surfaces of the casing is connectable to the module arrangement.

12. A module assembly comprising a module arrangement and an electronics module for coupling to the module arrangement in a line-up direction, wherein the electronics module includes a casing, which comprises, in relation to a state mounted on the module arrangement, a front side, a back side, and an upper side, a bottom side and two opposite lateral surfaces, lateral surfaces extending perpendicularly to the line-up direction, wherein an electronics is accommodated in the casing and at least one first bus connection and two second bus connections are provided, which are all connected to the electronics in the casing, wherein the at least one first bus connection is arranged either on the upper side or on the bottom side and one of the two second bus connections is arranged on each of the lateral surfaces, and wherein the electronics module abuts directly on a front face of the module arrangement in the line-up direction and is detachably connectable to the module arrangement in two different orientations in a non-destructive manner.

13. The module assembly according to claim 12, wherein the module arrangement has a fixedly predetermined mounting orientation, which defines a position of a front face of the module arrangement, wherein the line-up direction extends along the front side and perpendicular to the front faces of the module arrangement, and in each orientation of the electronics module the front side of the electronics module extends in extension of the front side of the module arrangement and along the line-up direction.

14. The module assembly according to claim 12, wherein an intermediate module is arranged adjacent to the electronics module in the module arrangement, which comprises a mechanical fastening device for connection to the electronics module.

15. The module assembly according to claim 12, wherein the electronics module is adapted to be connectable to the module arrangement with each of the two lateral surfaces thereof, even when rotated 180° around the axis of rotation, wherein the front face, which is oriented in the line-up direction, of the module arrangement, to which the electronics module is connected, comprises a bus connection for the internal bus of the module arrangement, which is compatible to the second bus connection of the electronics module, and wherein the second bus connection of the lateral surface of the casing, which is facing the module arrangement, is connected to the internal bus connection of the module arrangement, when the electronics module is mounted on the module arrangement.

16. The module assembly according to claim 15, wherein the connection between the second bus connection of the electronics module and the internal bus connection of the module arrangement is a plug-in connection, which is closed by plugging-in the electronics module in the line-up direction.

* * * * *